United States Patent
Mohapatra et al.

(10) Patent No.: US 10,229,997 B2
(45) Date of Patent: Mar. 12, 2019

(54) INDIUM-RICH NMOS TRANSISTOR CHANNELS

(71) Applicant: INTEL CORPORATION, Santa Clara, CA (US)

(72) Inventors: Chandra S. Mohapatra, Beaverton, OR (US); Anand S. Murthy, Portland, OR (US); Glenn A. Glass, Portland, OR (US); Tahir Ghani, Portland, OR (US); Willy Rachmady, Beaverton, OR (US); Jack T. Kavalieros, Portland, OR (US); Gilbert Dewey, Hillsboro, OR (US); Matthew V. Metz, Portland, OR (US); Harold W. Kennel, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/576,381

(22) PCT Filed: Jun. 23, 2015

(86) PCT No.: PCT/US2015/037141
§ 371 (c)(1),
(2) Date: Nov. 22, 2017

(87) PCT Pub. No.: WO2016/209210
PCT Pub. Date: Dec. 29, 2016

(65) Prior Publication Data
US 2018/0158944 A1 Jun. 7, 2018

(51) Int. Cl.
*H01L 29/78* (2006.01)
*H01L 29/66* (2006.01)
(Continued)

(52) U.S. Cl.
CPC ........ *H01L 29/785* (2013.01); *H01L 27/0886* (2013.01); *H01L 29/1054* (2013.01);
(Continued)

(58) Field of Classification Search
CPC ............. H01L 29/785; H01L 29/66795; H01L 29/1054
See application file for complete search history.

(56) References Cited

U.S. PATENT DOCUMENTS

| 4,032,951 A | 6/1977 | De Winter et al. |
| 2005/0239242 A1 | 10/2005 | Zhu et al. |

(Continued)

FOREIGN PATENT DOCUMENTS

| KR | 10-1226827 B1 | 12/2010 |
| WO | 2006125040 A2 | 11/2006 |
| WO | 2014209390 A1 | 12/2013 |
| WO | 2016209210 A1 | 12/2016 |

OTHER PUBLICATIONS

International Search Report and Written Opinion received for PCT/US2015/037141. dated Apr. 19, 2016, 15 pages.
(Continued)

*Primary Examiner* — Dung Le
(74) *Attorney, Agent, or Firm* — Finch & Maloney PLLC

(57) ABSTRACT

Techniques are disclosed for forming high mobility NMOS fin-based transistors having an indium-rich channel region electrically isolated from the sub-fin by an aluminum-containing layer. The aluminum aluminum-containing layer may be provisioned within an indium-containing layer that includes the indium-rich channel region, or may be provisioned between the indium-containing layer and the sub-fin. The indium concentration of the indium-containing layer may be graded from an indium-poor concentration near the aluminum-containing barrier layer to an indium-rich concentration at the indium-rich channel layer. The indium-rich
(Continued)

channel layer is at or otherwise proximate to the top of the fin, according to some example embodiments. The grading can be intentional and/or due to the effect of reorganization of atoms at the interface of indium-rich channel layer and the aluminum-containing barrier layer. Numerous variations and embodiments will be appreciated in light of this disclosure.

20 Claims, 9 Drawing Sheets

(51) Int. Cl.
  H01L 29/10     (2006.01)
  H01L 29/775    (2006.01)
  H01L 29/12     (2006.01)
  H01L 27/088    (2006.01)
  H01L 29/205    (2006.01)
  H01L 21/02     (2006.01)
(52) U.S. Cl.
  CPC .......... *H01L 29/125* (2013.01); *H01L 29/205* (2013.01); *H01L 29/66795* (2013.01); *H01L 29/775* (2013.01); *H01L 21/02241* (2013.01)

(56) References Cited

U.S. PATENT DOCUMENTS

| | | |
|---|---|---|
| 2012/0153352 A1 | 6/2012 | Dewey et al. |
| 2013/0099283 A1* | 4/2013 | Lin ................. H01L 29/267 257/190 |
| 2014/0252478 A1 | 9/2014 | Doornbos et al. |
| 2014/0327046 A1* | 11/2014 | Huang ............ H01L 21/823807 257/192 |
| 2014/0332851 A1 | 11/2014 | Cheng et al. |
| 2014/0357049 A1 | 12/2014 | Wu et al. |
| 2015/0162404 A1 | 6/2015 | Yang et al. |
| 2016/0027780 A1* | 1/2016 | Mitard ............... H01L 21/0245 257/190 |
| 2016/0133696 A1* | 5/2016 | Yin .................. H01L 29/66803 257/402 |
| 2016/0322222 A1* | 11/2016 | Cheng ............. H01L 21/02546 |

OTHER PUBLICATIONS

International Preliminary Report on Patentability received for PCT/US2015/037141. dated Jan. 4, 2018. 12 pages.

Extended European Search Report received for EP Application No. 15896504.6, dated Jan. 2, 2019. 8 pages.

* cited by examiner

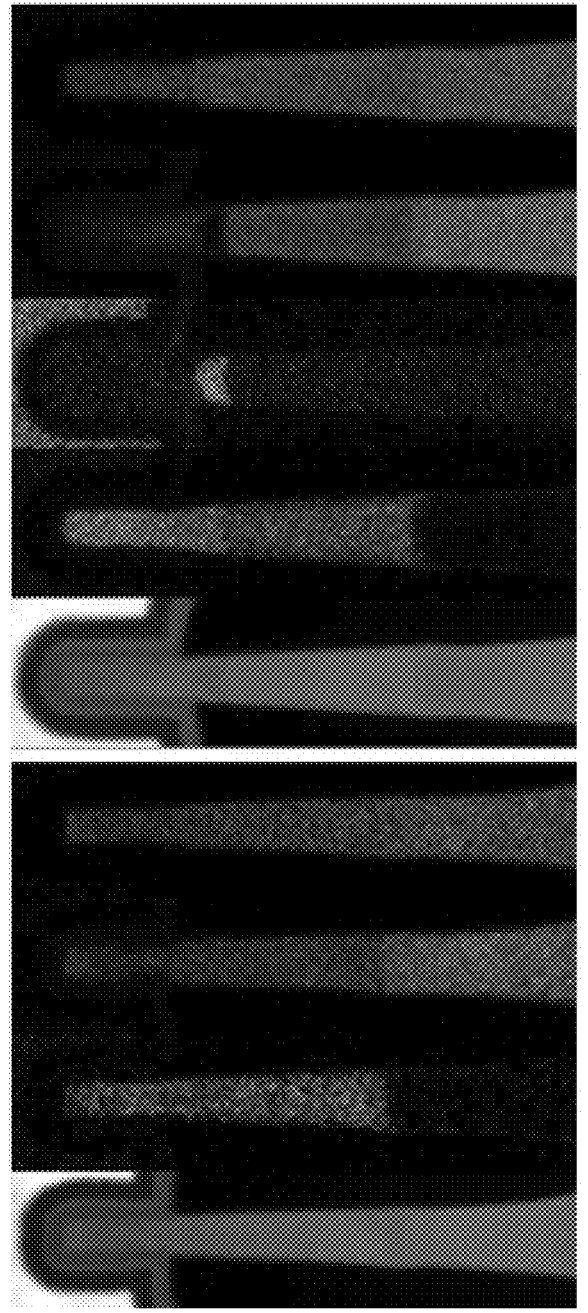

INDIUM-RICH NMOS TRANSISTOR CHANNELS

BACKGROUND

Maintaining mobility improvement and short channel control as microelectronic device dimensions continue to scale provides a challenge in device fabrication. In particular, during design and manufacture of metal-oxide-semiconductor (MOS) transistor semiconductor devices, such as those used in complementary metal-oxide-semiconductor (CMOS) devices, it is often desired to increase movement of electrons (carriers) in n-type MOS device (NMOS) channels and to increase movement of holes (carriers) in p-type MOS device (PMOS) channels. Fin-based transistor devices can be used to provide improved short channel control. Typical CMOS transistor devices utilize silicon as the channel material for both hole and electron majority carrier MOS channels. Switching to other channel materials can improve mobility. For example, an indium-rich indium gallium arsenide (InGaAs) in an NMOS channel on a gallium arsenide (GaAs) sub-fin produces high-mobility and better performance NMOS transistors, relative to conventional silicon NMOS transistors. However, there are a number of non-trivial issues associated with indium-rich NMOS channels.

BRIEF DESCRIPTION OF THE DRAWINGS

FIG. 2e' illustrates cross-section side view of an intermediate transistor structure resulting from the method of FIG. 1, in accordance with another embodiment of the present disclosure.

FIG. 3b' illustrates cross-section side view of an intermediate integrated transistor resulting from the method of FIG. 1, in accordance with another embodiment of the present disclosure.

FIG. 5a illustrates a composition map of a GaAs/InGaAs stack configured without a thin InAlAs barrier layer, and FIG. 5b illustrates a composition map of a GaAs/InGaAs stack configured with a thin InAlAs barrier layer in accordance with an embodiment of the present disclosure.

Figure 1:
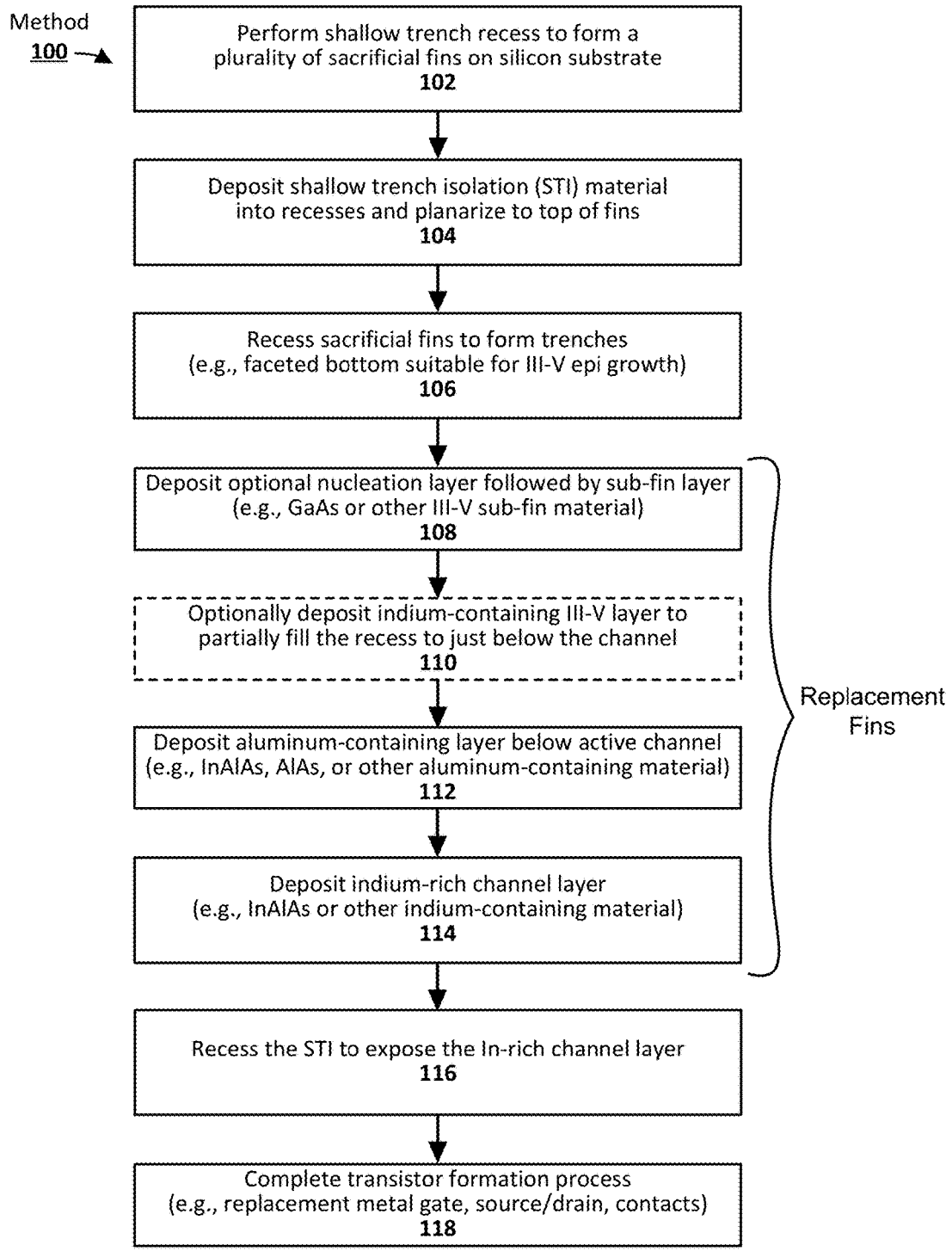
FIG. 1 illustrates a method for forming indium-rich NMOS transistor channels, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming high mobility NMOS fin-based transistors having an indium-rich channel region electrically isolated from the sub-fin by an aluminum-containing layer. The aluminum-containing layer may be provisioned within an indium-containing layer that includes the indium-rich channel region, or may be provisioned between the indium-containing layer and the sub-fin. The indium concentration of the indium-containing layer may be graded from an indium-poor concentration near the aluminum-containing barrier layer to an indium-rich concentration at the indium-rich channel layer. The indium-rich channel layer is at or otherwise proximate to the top of the fin, according to some example embodiments. The grading can be intentional and/or due to the effect of the aluminum aluminum-containing layer on the reorganization of atoms at the interface. Numerous variations and embodiments will be appreciated in light of this disclosure.

General Overview

As previously indicated, indium-rich NMOS transistor devices encourage higher electron mobility and better performance with respect to the conventional silicon NMOS transistor devices. For example, indium-rich InGaAs in an NMOS transistor channel on a GaAs sub-fin produces relatively high-mobility NMOS transistors. GaAs being a high band-gap (~1.4 eV) material that has a conduction band offset of ~0.4 eV to the InGaAs channel (50-70% indium in $In_xGa_{1-x}As$, such that x=0.5 to 0.7) is useful to cut off the sub-fin source-to-drain leakage to ensure that the electron conduction happens only through the channel. Thus, simply increasing the indium precursor flow to boost the indium concentration in the InGaAs would seemingly be a logical process route to such a composition profile. However, such increased indium flow has a strong expanding effect on the InGaAs lattice constant with respect to the GaAs sub-fin. This is a definite source of defects such as misfit dislocations, stacking faults, and other defects emanating from the GaAs/InGaAs interface. These defects in turn degrade transistor performance.

Thus, and in accordance with an embodiment of the present disclosure, techniques are provided that allow for a boost in indium concentration in indium-rich III-V channels, so as to provide high mobility low-defect III-V transistors. In particular, by depositing a relatively thin aluminum-containing III-V layer between the sub-fin and the indium-rich channel (e.g., InGaAs channels), the indium concentration of the indium-rich channel can be significantly increased (e.g., by up to 3×, or more), and without degrading the overall crystalline microstructure of the device. The thin aluminum-containing provides electrical isolation to the sub-fin by virtue of its conduction band offset of ~0.4 eV to the indium-rich channel. In some embodiments, for instance, the source-to-drain sub-fin leakage is cut down by at least 4 orders of magnitude. Compared to simply increasing the indium concentration (e.g., by increasing the indium precursor flow ratio, or by some other suitable means), the structure resulting from the techniques provided herein can be accomplished with excellent film quality.

In one specific example configuration, an InGaAs NMOS channel is provided on a GaAs sub-fin. This InGaAs channel has an indium concentration in the range of 30% to 70% ($In_xGa_{1-x}As$, such that x=0.3 to 0.7). A thin layer of aluminum-containing material is deposited between the GaAs sub-fin and the InGaAs channel, just underneath the InGaAs channel. The aluminum-containing layer can be, for example, a 5 nm to 15 nm thick layer of indium aluminum arsenide (InAlAs) or aluminum arsenide (AlAs), although other compatible aluminum-containing layers can be used as will be appreciated in light of this disclosure. In any case, the aluminum-containing layer effectively provides electrical isolation to the sub-fin by virtue of its conduction band offset of ~0.4 eV to the InGaAs channel (or other indium-rich channel). In addition, the overall crystalline microstructure in the NMOS channel is not degraded in comparison to a comparable GaAs/InGaAs channel transistor having the same indium concentration (e.g., 53%<In<70%, wherein for $In_xGa_{1-x}As$, such that x varies from 0.53 to 0.70) but no aluminum-containing layer.

As will be appreciated, III-V compounds, such as AlAs, InAlAs or InAlGaAs, operate in accordance with stoichiometric principles. For example, for arsenide-containing compounds, the arsenide component is always considered 100%, and the percentage of other group III-V elements in the compound can be worked out accordingly (equivalently called as stoichiometry). For instance, the percentage of aluminum or indium in a binary III-V compound such as AlAs or InAs becomes 100% which is trivial. For a ternary compound, such as $In_{1-x}Al_xAs$ or $In_xAl_{1-x}As$, x refers to the percentage of aluminum or indium respectively (where x varies from 0 to 1 and is multiplied by 100 to be measured as a percentage). Another ternary example is $In_{1-x}Ga_xAs$ or $In_xGa_{1-x}As$, where x refers to the percentage of gallium or indium respectively (where x varies from 0 to 1 and is multiplied by 100 to be measured as a percentage). In such ternary III-V compounds, the percentage of certain elements, such as aluminum, indium, and gallium, can be adjusted or tuned. For instance, and in accordance with some embodiments herein, the percentage of aluminum in the aluminum-containing layer can be tuned so as to obtain a desired conduction band offset (e.g., 0.4 eV) with respect to an InGaAs channel. For a quaternary compound like $In_{1-x-y}Al_xGa_yAs$, x and y are the percentage of aluminum and gallium, respectively. The percentage of aluminum (x) can be adjusted so as to achieve the desired conduction band offset (e.g., 0.4 eV) with an InGaAs channel.

The aluminum-containing layer may be implemented, for example, within the indium-containing III-V layer, or between the III-V sub-fin layer and the indium containing III-V layer. Aluminum precursor flows can be selectively controlled to so as to provide the desired location of the aluminum-containing layer. The position of the aluminum-containing layer in the stack can vary from one embodiment to the next, depending on factors such as desired channel location and height, and other factors such as the depth of the shallow trench isolation (STI) recess. In some cases, the aluminum-containing layer is below the top surface of the STI, while in other embodiments the aluminum-containing layer is above the top surface of the STI. Variations will be apparent in light of this disclosure, so long as source-to-drain current sub-fin current leakage is inhibited by the intervening aluminum-containing layer.

As will be further appreciated in light of this disclosure, the interface between the lower III-V sub-fin and the upper indium-rich channel resulting from the techniques provided herein will have a relatively low defect count. In more detail, device quality can be based on, for example, a defect count obtained by summing up dislocations and stacking faults at the interface and in the epitaxial layer, with defect counts greater than 10000 per linear centimeter (cm) of fin length being unacceptable for device grade applications, in accordance with an embodiment of the present disclosure. Typical defect count densities of indium-rich channel structures obtained by simply increasing the indium precursor flow and having no aluminum-containing barrier layer are above 10000 per linear cm of fin length. In contrast, dislocation and stacking fault counts below 1000 per linear cm, or below 500 per linear cm, or below 100 per linear cm, or below 50 per linear cm, and as low as zero defects per linear cm, may result at the interface when using aluminum-containing barrier layers as provided herein, in accordance with some embodiments. To this end, "substantially defect free" as used herein can be quantified in terms such as defect count per linear cm of fin length (or other area of interest), such that the combined count of dislocation and stacking faults at the interface between the sub-fin material layer and the indium-rich channel layer is below 10000 per linear cm, and in some embodiments below 5000 per linear cm, or below 1000 per linear cm, or below 500 per linear cm, or below 100 per linear cm, or below 50 per linear cm, and as low as zero defects per linear cm. As will be appreciated, such a defect count can readily be extrapolated to areas smaller than a linear centimeter. For instance, in some embodiments, the defect count at a 10 nanometer (nm) length is below interface 0.001 defects per linear nm (extrapolated from 10000 defects per linear centimeter), or below 0.0001 defects per linear nm (extrapolated from 1000 defects per linear centimeter), or below 0.00001 defects per linear nm (extrapolated from 100 defects per linear centimeter), or below 0.000001 defects per linear nm (extrapolated from 10 defects per linear centimeter), and so on, down to zero defects per linear nm. In a more general sense, an interface between the sub-fin material layer and the indium-rich channel configured with an aluminum-containing barrier layer in accordance with an embodiment of the present disclosure has less than 10K defects/linear cm, or less than 1K defects/linear cm, or less than 500 defects/linear cm, or less than 100 defects/linear cm, or less than 50 defects/linear cm. Thus, in one specific example case, the aluminum-containing interface between a GaAs sub-fin and an indium-rich channel has less than 10K defects/linear cm, or less than 1K defects/linear cm, or less than 500 defects/linear cm, or less than 100 defects/linear cm, or less than 50 defects/linear cm.

The techniques provided herein can be embodied, for example, in any number of integrated circuits, such as memory devices, processors and other such devices that are fabricated with transistors and other active junction semiconductor devices, as well as in methodologies suitable for practice at fabs where integrated circuits are made. Use of the techniques described herein manifest in a structural way. For instance, transistor structures according to an embodiment of the present disclosure can be imaged by transmission electron microscopy (TEM) to show a cross-section of the heterojunction of the III-V material stack with the thin intervening aluminum-containing layer between the sub-fin and indium-rich channel (e.g., GaAs/InGaAs/thin-InAlAs/InGaAs or GaAs/thin-InAlAs/InGaAs) is essentially defect-free or otherwise low-defect within the resolution of the technique. A composition map in the channel region can be used to show that the bottom of the fin is gallium-rich (sub-fin) whereas the top of the fin is indium-rich.

In general, indium-rich III-V material such as InGaAs has higher carrier mobility as compared to gallium-rich InGaAs, provided both materials are free of misfit dislocations and other crystalline imperfections. For purposes of clarity, note that 'indium-rich' indicates that the indium concentration in the InGaAs is higher than the gallium concentration; likewise, 'gallium-rich' would indicate that the gallium concentration is higher than the indium concentration. Further note that concentrations may be graded. As such, when a component of a compound layer is said to be 'rich' that compound layer may include both a component-rich portion and a component-poor portion with respect to that component (i.e., the component need not be rich continuously throughout the entire layer). While the process flows demonstrate non-planar transistor designs such as fin-based tunneling field effect transistors (T-FETs) and FinFETs (e.g., tri-gates or other non-planar transistor structures that evolve from fins such as all-around gates, nanowire and nanoribbon gates), the techniques provided herein can equally well be used in a planar transistor design, as will be appreciated. In any such cases, the techniques provide indium-rich III-V transistors having higher mobility and performance, and reduced off-state leakage current, as well as reduced defect counts, relative to indium-rich III-V transistors formed with standard processing.

Methodology and Architecture

FIG. 1 illustrates a method 100 for forming indium-rich NMOS transistor channels, in accordance with an example embodiment of the present disclosure. FIGS. 2a-e illustrate perspective views of various intermediate transistor structures resulting from the method 100. As will be appreciated, the example method 100 is described here in the context of non-planar fin-based transistors, but can be readily extrapolated to other transistor configurations such as gate-all-around transistors, nanowire (or nanoribbon, as the case may be) and planar transistors as well.

The method commences at 102 with performing a shallow trench recess process to form a plurality of fins on a silicon substrate. Other substrates may be used as well, as further discussed below. The fins are sacrificial in nature in that they will ultimately be removed and replaced with a III-V material stack having an indium-rich channel area, as will be discussed in turn. The shallow trench etch can be accomplished with standard photolithography including hardmask patterning and wet and/or dry etching, or with patterning by backbone and spacer layer as is sometimes done. The geometry of the trenches (width, depth, shape, etc) can vary from one embodiment to the next as will be appreciated, and the present disclosure is not intended to be limited to any particular trench geometry. In one specific example embodiment having a silicon substrate and a two-layer hardmask implemented with a bottom local oxide layer and a top silicon nitride layer, a dry etch is used to form the trenches that are about 100 Å to 5000 Å (10 nm to 500 nm) below the top surface of the substrate. The trench depth can be set depending on factors such as the desired sacrificial fin height as well as how much of the sacrificial fin will be removed, and the desired thickness of the STI material to be deposited. After the fins are formed, a planarization process can be executed to prepare the structure for subsequent processing and to remove any hardmask material.

Figure 2A:
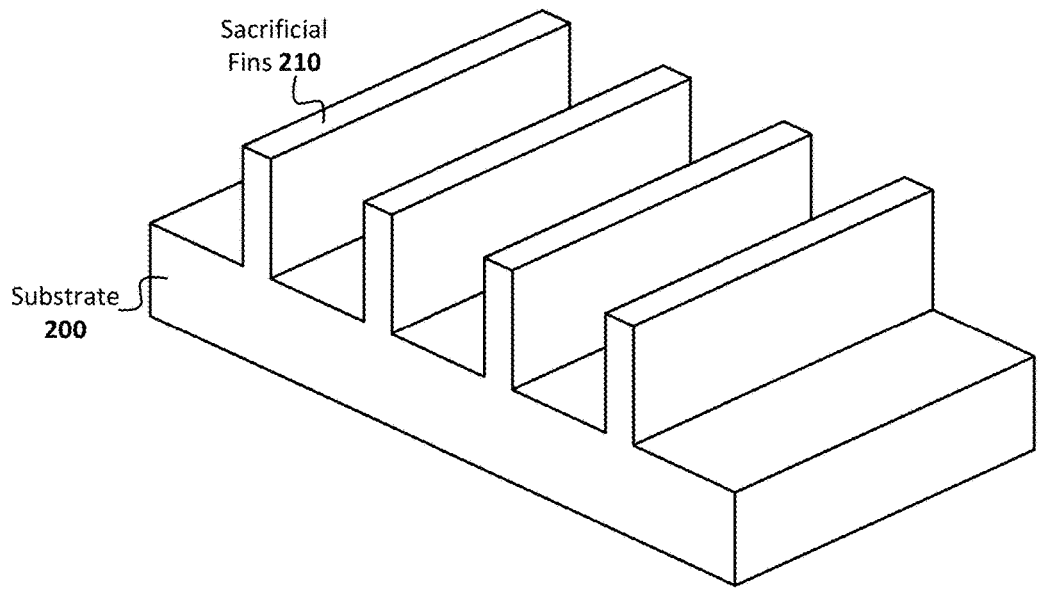
FIGS. 2a-e each illustrates a perspective view of various intermediate transistor structures resulting from the method of FIG. 1, in accordance with an embodiment of the present disclosure.

FIG. 2a shows an example structure resulting from the shallow trench recess process at 102. As can be seen, substrate 200 has a plurality of sacrificial fins 210 extending therefrom. Any number of suitable substrates can be used here, including bulk substrates, semiconductor-on-insulator substrates (XOI, where X is a semiconductor material such as silicon, germanium, SiGe, or III-V material), and multi-layered structures. In one specific example case, the substrate 200 is a bulk silicon substrate. In another example case, the substrate 200 is a bulk III-V material substrate, such as a bulk GaAs substrate. In another example case, the substrate 200 is a silicon-on-oxide, or III-V-on-oxide such as GaAs-on-oxide or gallium antimonide on oxide. In another example case, the substrate 200 is a multilayered substrate having a III-V layer on a silicon layer, such as GaAs on silicon. Any number of suitable configurations can be used for substrate 200, so long as the system can support indium-rich channel regions with an aluminum-containing barrier layer, as will be apparent in light of this disclosure.

While the illustrated embodiment shows fins 210 as having a width that does not vary with distance from the substrate, the fin may be narrower at the top than the bottom in other embodiments, wider at the top than the bottom in still other embodiments, or having any other width variations and degrees of uniformity (or non-uniformity) in still other embodiments. Further note that the width variation may, in some embodiments, be symmetrical or asymmetrical. Also, while the sacrificial fins 210 are illustrated as all having the same width, some fins 210 may be wider and/or otherwise shaped differently than others. For instance, as the width of the sacrificial fins is what will actually be used for the active fins, the width of the sacrificial fin can be used to set the width of those active fins. So, for example, some of the sacrificial fins 210 may be narrower to provide active fins that are narrow, while others of the sacrificial fins 210 may be wider to provide active fins that are wider. In some example embodiments, the fin width, which defines the width of the diffusion area of a fin-based transistor device, can be less than 50 nm, or less than 40 nm, or less than 30 nm, or less than 20 nm, or less than 10 nm. In a more general sense, the fins can be patterned to have widths that are much narrower relative to, for instance, planar transistor technologies even for the same process node. Numerous other arrangements may be implemented, as will be appreciated in light of this disclosure.

Figure 2B:
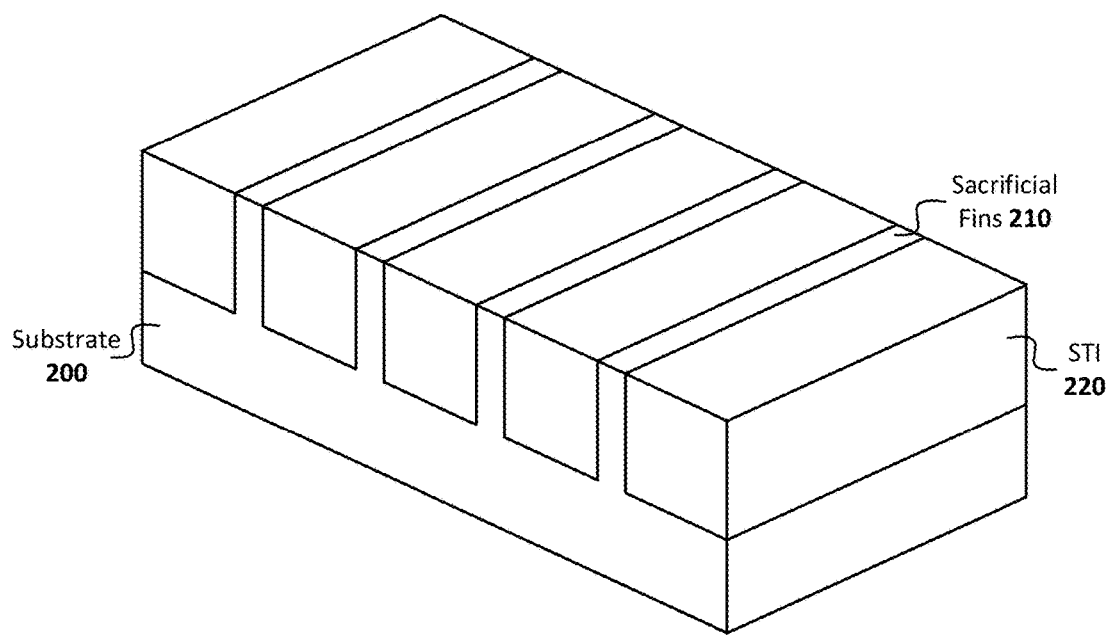

With further reference to FIG. 1, the method 100 continues at 104 with depositing shallow trench isolation (STI) material into the recesses and planarize to top of fins. FIG. 2b shows an example of the resulting structure, according to one embodiment. The trenches can be filled with any suitable insulator material (e.g., an oxide, nitride, polymer, or other suitable insulator) to form the STI structures 220, using any number of standard deposition processes. In one specific example embodiment having a silicon substrate, the deposited insulator material is silicon dioxide ($SiO_2$). In still other embodiments, a low-k dielectric can be used. Examples of low-k dielectric materials include, for instance, porous oxides such as $SiO_2$, doped oxides as carbon-doped $SiO_2$ or fluorine-doped $SiO_2$ or any such doped materials configured with a degree of porosity, polyimides and polymers such as spin-on silicon based polymeric dielectrics and spin-on organic polymeric dielectrics, fluorine-doped amorphous carbon, spin-on Teflon/PTFE. In some embodiments, an annealing process may be carried out on the dielectric layer to improve its quality when a low-k material is used. The deposited insulator material for filling the trenches can be selected, for example, based on compatibility with the replacement fin material to be added later in the process. As can be further seen, FIG. 2b demonstrates the structure after the STI material 220 is planarized down to the top of the sacrificial fins 210 using, for example, chemical mechanical planarization (CMP) or other suitable process capable of planarizing the structure, according to an embodiment.

Figure 2C:
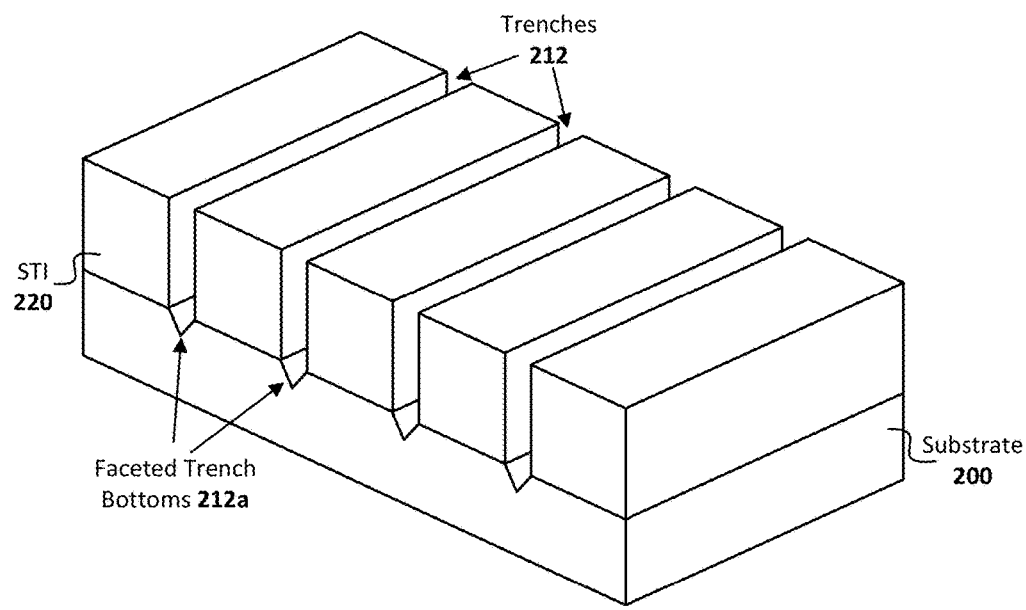

With further reference to FIGS. 1 and 2c, the method 100 continues at 106 with recessing sacrificial fins 210 to form trenches 212. The etch can be tailored so as to form trenches of controlled size and shape, depending on factors such as the etch chemistry used and the crystalline structure of the substrate 200. The etch can be a dry or wet etch or a combination of two. In one example embodiment, the substrate 200 is a bulk crystalline silicon substrate and etch is accomplished with a standard ammonium hydroxide etch so as to provide {111} faceting at the bottom 212a of the trenches 212. Such a faceted trench bottom 212a will facilitate the growth of a III-V epitaxial layer according to some embodiments, although other trench bottom geometries are possible. In a more general sense, the trench morphology can be tailored to provide a trench bottom interface having the desired morphology for a given material system. So, for example, a faceted silicon trench filled with III-V material is one example material system, and other trench morphologies and material systems may be used as well.

Figure 2D:
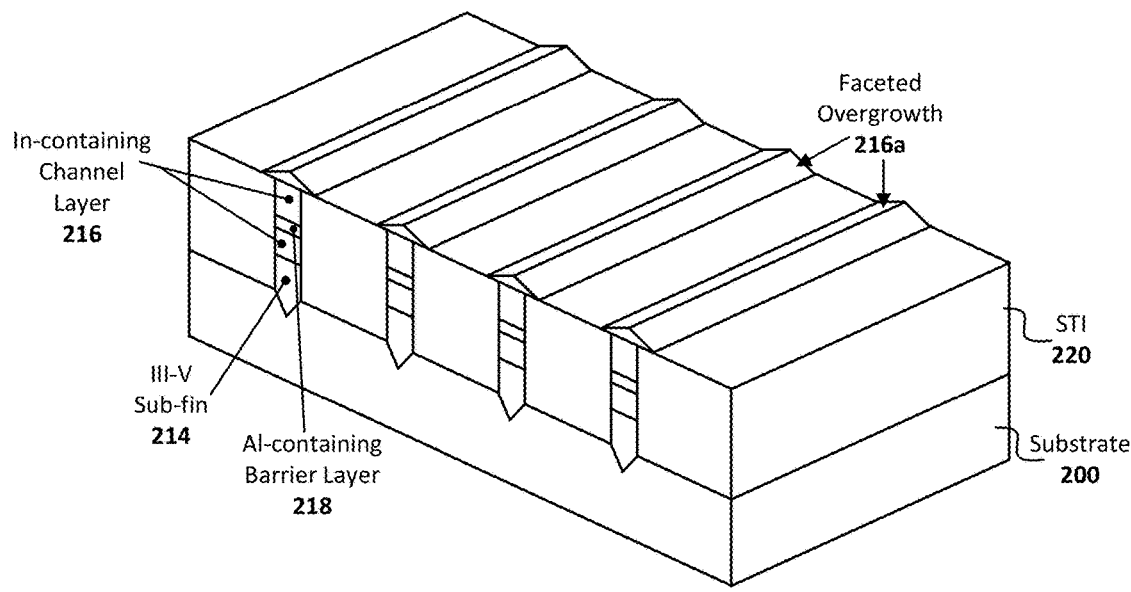

With further reference to FIGS. 1 and 2d, the method 100 continues at 108 through 112 with depositing the replacement fins, which will generally include an indium-rich channel region. This deposition can be carried out selectively, such that the replacement material is directionally deposited into the trenches 212. The deposited replacement channel can be made of, for example, a single III-V material, a bi-layer stack, or a tri-layer stack, although any number of multi-layer configurations can be used to provide indium-rich channels, as will be appreciated in light of this disclosure.

In more detail, and with reference to the example embodiment shown in FIG. 1, the method 100 continues at 108 with depositing an optional III-V nucleation layer followed by a III-V sub-fin 214. The use of a nucleation layer will depend on the affinity of the III-V sub-fin material for the substrate material and the compatibility between the substrate and sub-fin materials (e.g., with respect to lattice matching and crystalline structure, dislocations, and stacking faults). For instance, in one specific example embodiment, the substrate 200 is a bulk silicon substrate and the sub-fin is epitaxial GaAs. In such cases, the epitaxial growth starts with a GaAs nucleation layer to wet the {111} faceted trench, followed by the GaAs sub-fin 214. In this example case, the nucleation layer is effectively a monolayer or otherwise relatively thin initial layer of sub-fin 214 material that is ultimately non-distinguishable from the GaAs sub-fin 214. In other cases, the nucleation layer may be a monolayer or otherwise relatively thin initial layer of transitional material, whether graded or not, that provides a suitable transition between the substrate 200 and sub-fin 214 materials. To this end, the quality of the interface between the substrate 200 and sub-fin 214 materials can be improved or otherwise manipulated with a nucleation layer, in accordance with some embodiments. Other embodiments may need no nucleation layer. Numerous configurations can be made.

With further reference to FIGS. 1 and 2d, the method 100 continues at 110 with optionally depositing an indium-containing III-V layer 216 to partially fill the trench 212 to just below the active channel. Alternatively, the III-V sub-fin material deposited at 108 can be provisioned to fill the trench 212 to just below the active channel, as shown in the example embodiment of FIG. 3a. In this latter case, the optional deposition of indium-containing III-V layer 216 to partially fill the trench 212 is not needed. If such a partial fill with an indium-containing layer 216 is utilized, it is to be noted that the indium concentration of that partial fill can be graded from a low concentration more compatible with the sub-fin (e.g., 5% In, or lower) to a higher concentration more compatible with the aluminum-containing layer 218 (e.g., ~50%). Such grading is not needed, however, and other embodiments may have a consistent rich concentration of indium throughout, with the aluminum-containing layer 218 within the indium-containing layer 216. The method 100 continues at 112 with depositing an aluminum-containing layer 218 below the active channel, and further continues at 114 with depositing an indium-rich channel layer 216 to fill the remainder of the trench 212 so as to form the active channel portion of the replacement fin. Thus, the aluminum-containing layer 218 may be provisioned within the indium-containing layer 216 according to some embodiments (e.g., FIG. 2d), or between the sub-fin 214 and the indium-containing layer 216 according to other embodiments (e.g., FIG. 3a).

In one specific example embodiment having a silicon substrate 200 and an aluminum-containing layer 218 provisioned within the indium-containing layer 216 (similar to that shown in FIG. 2d), the indium-containing III-V layer 216 is an epitaxially grown layer of InGaAs that starts from a GaAs sub-fin 214 and fills up the trench 222 with considerable {111} faceted overgrowth 216a on the plane of STI 220, except that a relatively thin InAlAs (e.g., ~50% Al, where $In_{1-x}Al_xAs$, such that x=0.45 to 0.55) layer 218 is provisioned or otherwise sandwiched within the InGaAs layer 216 and positioned aptly just underneath the active channel portion of the replacement fin. Appropriate adjustments can be made to the gallium and aluminum precursor flows during a stabilization step preceding the epitaxial deposition of the aluminum-containing layer 218 within the indium-containing layer 216. For instance, the indium concentration is dialed down and the aluminum concentration is simultaneously dialed up during the stabilization step preceding the epitaxial growth of the aluminum-containing layer just below the active channel. Further note that the indium concentration prior to the beginning of the aluminum-containing growth may be graded, as previously explained, but need not be.

Figure 3A:
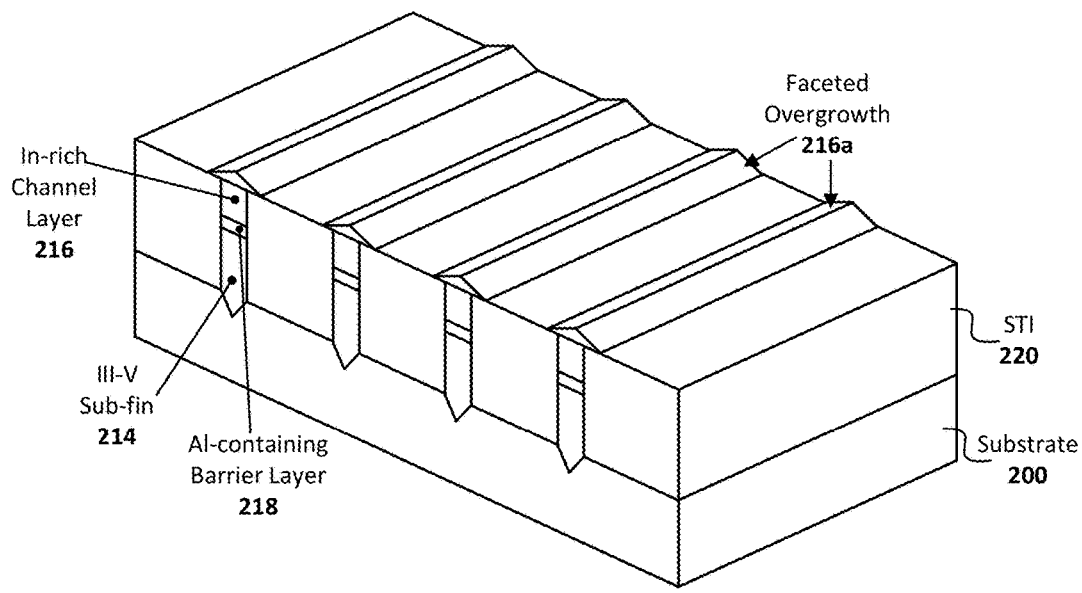
FIGS. 3a-b each illustrates a perspective view of various intermediate transistor structures resulting from the method of FIG. 1, in accordance with an embodiment of the present disclosure.

In another specific example embodiment having a silicon substrate 200, an aluminum-containing layer 218 is provisioned between the sub-fin 214 and the indium-rich layer 216 (similar to that shown in FIG. 3a). In one such example embodiment, the sub-fin 214 is GaAs and is epitaxially grown in the trench 222 to just under the active channel of the replacement fin. Then, the aluminum-containing layer 218 is epitaxially grown or otherwise provisioned on the sub-fin 214 with a relatively thin $In_{1-x}Al_xAs$ (e.g., ~50% Al, where x=0.45 to 0.55) layer. Then, the indium-rich layer 216 is epitaxially grown or otherwise provisioned on layer 218 with an $In_xGa_{1-x}As$ layer (e.g., ~50% In, where x=0.45 to 0.55) so as to fill remainder of the trench 212 with considerable {111} faceted overgrowth 216a on the plane of STI 220. The size of the channel may vary. For instance, in one example scenario, the sub-fin 214 fills about three-quarters of the trench 222, and the indium-rich layer 216 fills the remainder, less the thickness of the intervening aluminum-containing layer 218.

In any such embodiments, the aluminum-containing layer 218 may have a nominal thickness in the range of, for example, 2 nm to 25 nm, or 4 nm to 20 nm, or 5 nm to 20 nm, or 5 nm to 15 nm, or 5 nm to 10 nm; other suitable thicknesses can be used as well, so as to meet desired current leakage and defect density goals. As will be also appreciated in light of this disclosure, the concentration of aluminum in the aluminum-containing III-V layer 218 may also vary from one embodiment to the next, but in some cases is in the range of, for instance, 40% to 60%, or 45% to 55%, or 46% to 52%. Note that the aluminum percentage of layer 218 can be selected for compatibility to the indium percentage of the indium-containing III-V layer 216. Further note that percentages as used here refer to the stoichiometric concentration of the element (here aluminum) in the ternary compound of $In_{1-x}Al_xAs$ where x (multiplied by 100) is the percentage of aluminum referred.

For instance, in one specific example embodiment, the indium-containing III-V layer 216 is $In_{0.53}Ga_{0.47}As$ and the aluminum-containing III-V layer 218 is $In_{0.52}Al_{0.48}As$. Note that the $In_{0.53}Ga_{0.47}As$ layer 216 and the $In_{0.52}Al_{0.48}As$ layer 218 are exactly lattice matched to each other. To this end, it is possible to target concentrations of aluminum in the aluminum-containing layer 218 and indium in the indium-containing layer 216 of around ~50% (e.g., 40% to 60%, or 45% to 55%, or 45% to 54%, or 45% to 53%, or 46% to 53%, or 46% to 52%) so that there is no or little gross lattice mismatch across the hetero-structure, according to some embodiments. In some embodiments, the aluminum concentration of the aluminum-containing layer 218 and indium concentration of the indium-rich layer 216 are configured to be within 20% of each other, or within 10% of each other, or within 5% of each other. Note that a natural grading effect may occur given the natural re-organization of atoms, depending on the atoms included in the layers 216 and 218. This reduces misfit-dislocations, stacking-faults, and other defects coming from the interface that could hamper electron mobility in the NMOS channel. Note, however, that an exact lattice match is not required in all embodiments. To this end, a range of acceptable defect counts (e.g., 10000 defects per linear cm of fin length, or less) can be used to determine the material concentrations and quality of the interface between the aluminum-containing III-V layer 218 and indium-containing III-V layer 216.

In such embodiments, and as will be further appreciated in light of this disclosure, both InAlAs and GaAs are suitable to cut down the sub-fin leakage by several orders of magnitude because of the higher conduction band offset (~0.4 eV) to the InGaAs channel 216. The apt position of the InAlAs diffusion barrier 218 ensures that the active fin (portion of 216 above 218) is electrically isolated from the sub-fin 214. Other embodiments can be used to achieve similar results, where an aluminum-containing III-V layer 218 is provisioned under the channel of an indium-rich layer 216. For instance, the sub-fin 214 may be implemented with GaAs, the aluminum-containing layer 218 can be AlAs, and the indium-containing layer 216 can be InGaAs or indium arsenide (InAs). In still another embodiment, the sub-fin 214 may be implemented with gallium antimonide (GaSb), the aluminum-containing layer 218 can be aluminum antimonide (AlSb), and the indium-containing layer 216 can be indium antimonide (InSb). In still another embodiment, the sub-fin 214 may be implemented with gallium phosphide (GaP), the aluminum-containing layer 218 can be aluminum phosphide (AlP), and the indium-containing layer 216 can be indium phosphide (InP). In still another embodiment, the sub-fin 214 may be implemented with GaAs, the aluminum-containing layer 218 can be aluminum indium arsenide (AlInAs), and the indium-containing layer 216 can be InGaAs. In still another embodiment, the sub-fin 214 may be implemented with gallium arsenide antimonide (GaAsSb), the aluminum-containing layer 218 can be aluminum gallium arsenide antimonide (AlGaAsSb), and the indium-containing layer 216 can be indium gallium arsenide antimonide (InGaAsSb). Any such systems can be implemented on a bulk silicon substrate. Numerous other variations and embodiments will be apparent, and the present disclosure is not intended to be limited to any particular III-V systems. As previously explained, the III-V material system variations are effectively only limited with respect to material incompatibilities and unacceptable defect densities at the various interfaces. Any such variations can be used in accordance with an embodiment of the present disclosure where an intervening aluminum-containing layer is provisioned under an indium-rich channel to reduce sub-fin leakage, by virtue of conduction band offset to the indium-rich channel layer.

Note that the indium concentration of layer 216 may be graded due to various factors. For instance, as the indium concentration of an InGaAs layer increases, the gallium concentration of that layer decreases accordingly. As will be appreciated in light of this disclosure, some grading of the indium concentration may occur due to the presence of the aluminum-containing layer 218, whether within the indium-containing layer 216 or between the indium-containing layer 216 and the III-V sub-fin 214. As will be discussed in turn with respect to FIGS. 4a-b, the presence of the aluminum-containing layer 218 effectively drives the re-organization of the indium-gallium atoms in InGaAs channel in a graded fashion.

Figure 2E:
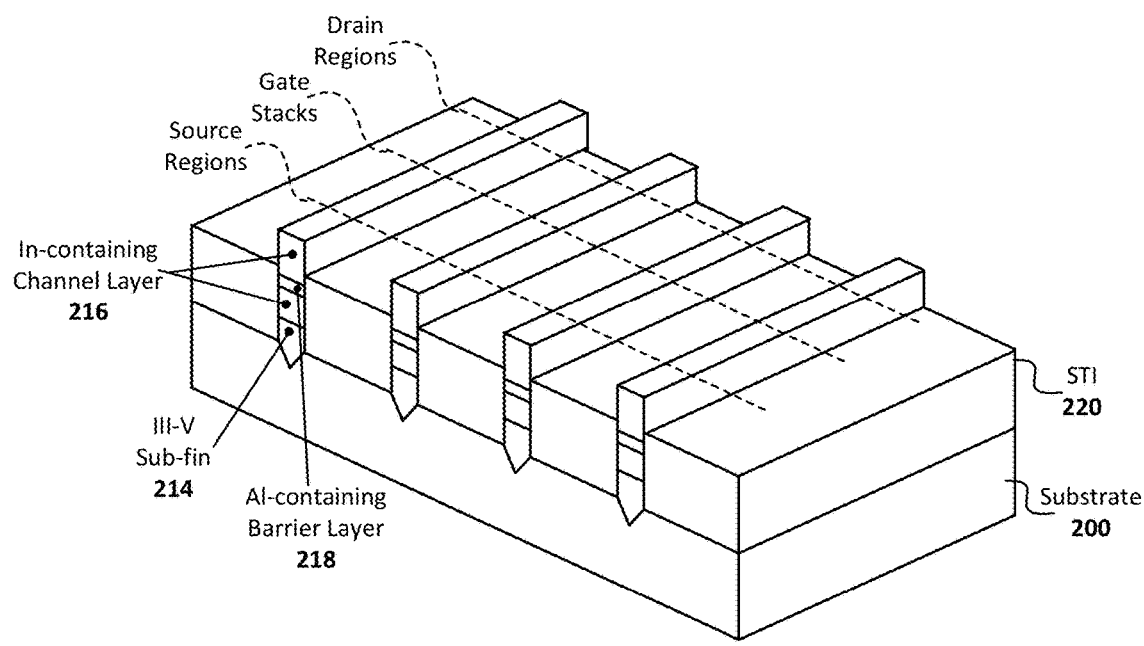
Figure 2E:
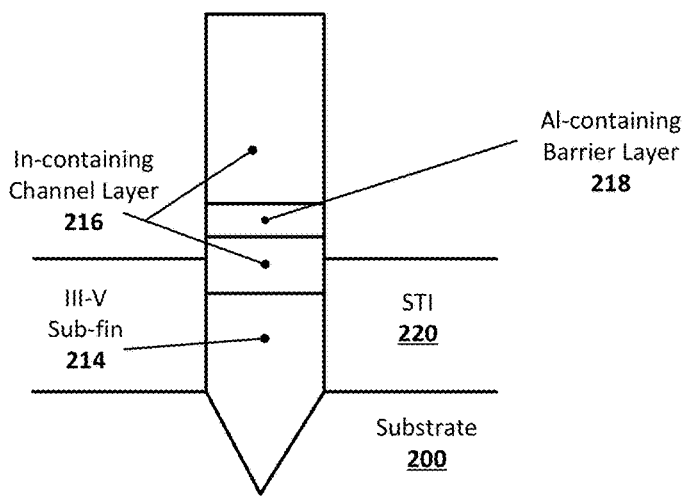
Figure 3B:
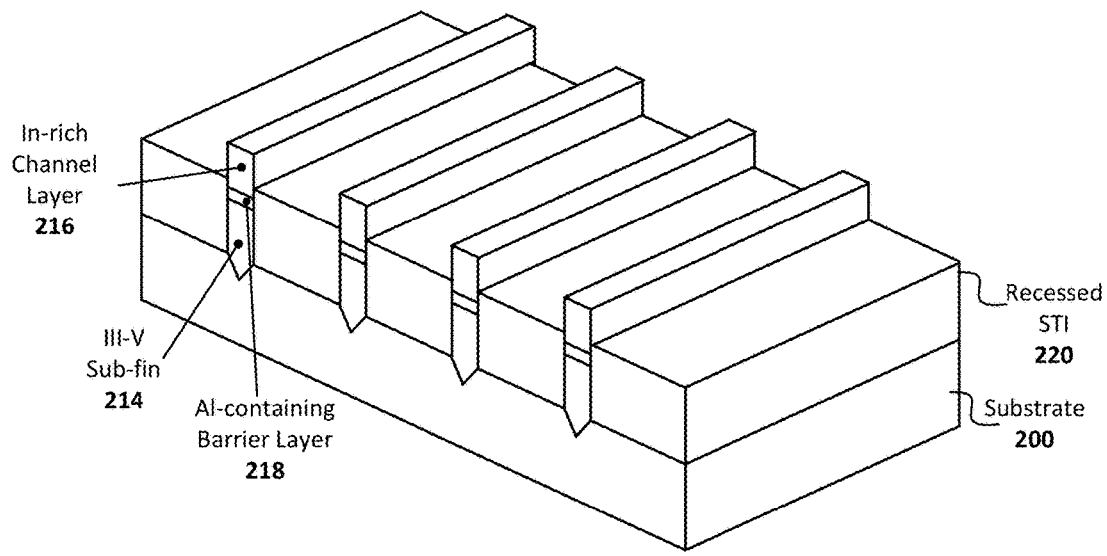
Figure 3B:
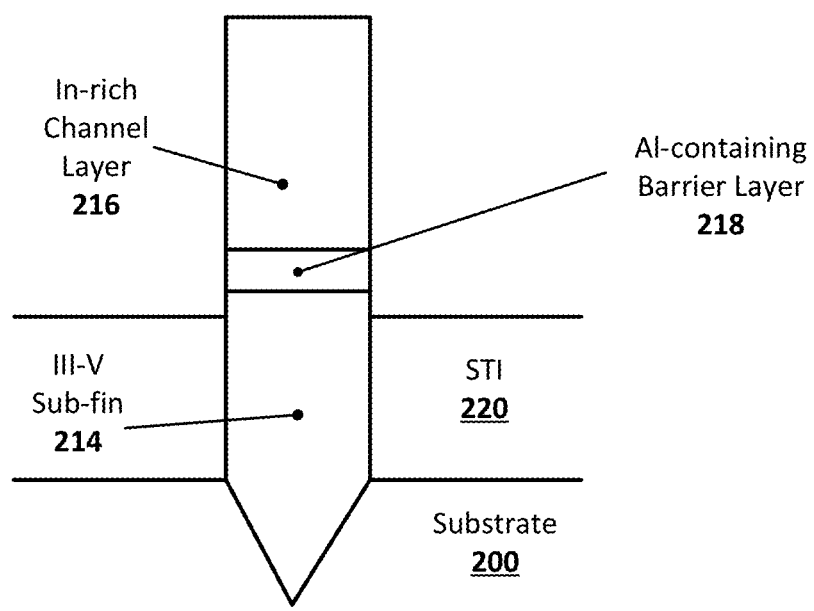

With further reference to FIG. 1, the method 100 continues at 116 with recessing the STI 220 to expose the indium-rich channel layer 216. Note that a polishing process may be carried out to remove any excess replacement channel material overgrowth 216a, as needed, prior to the recessing at 116. Various structures can result from this STI recess process. For example, FIG. 2e shows the resulting structure according to one embodiment, where the aluminum-containing layer 218 is within the indium-containing layer 216. FIG. 3b shows the resulting structure according to another embodiment, where the aluminum-containing layer 218 is provided between a relatively longer sub-fin 214 and a relatively shorter indium-rich layer 216. Further note that in either of these example embodiments, the depth of the STI recess can vary. For instance, the STI 220 can be recessed to just above the aluminum-containing layer 218 in some cases such as shown in FIGS. 2e and 3b, while in other cases the STI 220 can be recessed to just below the aluminum-containing layer 218, as shown in FIGS. 2e' and 3b'. In still other cases, the recess depth may coincide with the aluminum-containing layer 218.

With further reference to FIG. 1, the method 100 continues at 118 with completing the transistor formation process. FIG. 2e generally shows where gate stacks and source/drain regions are formed on the structure. Thus, after the indium-rich replacement channels 216 having the aluminum-containing barrier layer 218 are formed, the process flow may continue in a standard manner, in some embodiments, or in a custom or proprietary manner in still other embodiments. Some flows may process the gate first followed by source/drain processing, while other flows may employ a gate-later process or so-called replacement metal gate (RMG) process where a dummy gate structure is initially provided and the actual gate is formed later in the process. For example, an RMG flow may include deposition of a passivation layer like silicon and/or a metal and/or a metal oxide along with a dummy gate oxide and dummy polysilicon gate electrode, followed by polysilicon patterning, source drain processing, insulator over everything, planarization, removal of dummy gate electrode polysilicon, and removal of dummy gate oxide, followed by depositing of gate oxide stack and metal gate fill, followed by planarization again. Contact patterning and processing can proceed using any standard processes. In addition, the source/drains may be native to the replacement fins in some embodiments, while in other embodiments are implemented with replacement source/drain materials. The entire structure can then be encapsulated or covered with an insulator layer, planarized and any necessary contacts and interconnect layers can then be formed.

Figures 4A, 4B:
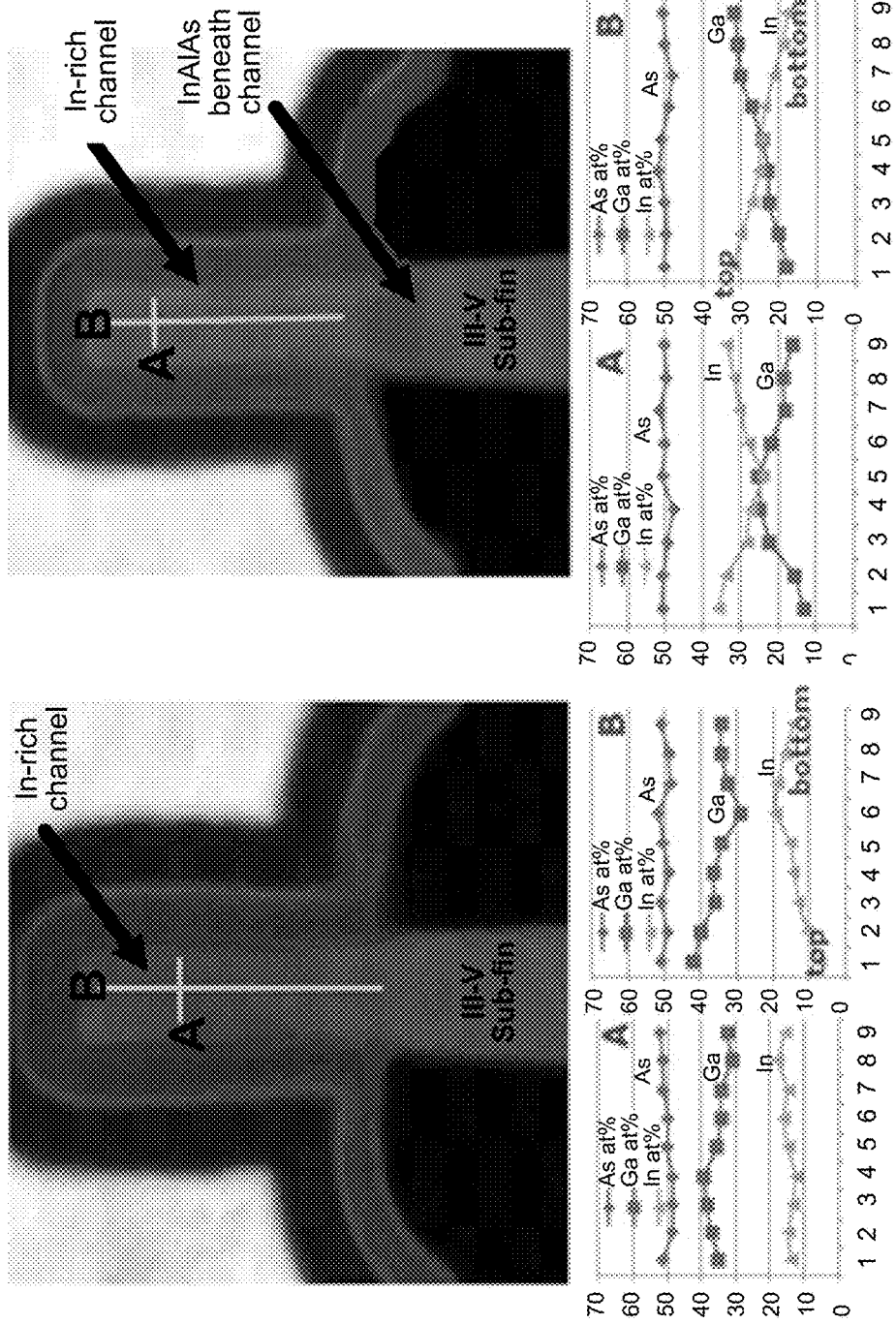
FIG. 4a illustrates a STEM cross-section of an active fin configured with an InGaAs channel.
FIG. 4b illustrates a STEM cross-section of an active fin configured with an InGaAs channel on a thin-InAlAs diffusion barrier in accordance with an embodiment of the present disclosure.

FIG. 4a illustrates a STEM cross-section of an active fin configured with an InGaAs channel on a GaAs sub-fin, and FIG. 4b illustrates a STEM cross-section of an active fin configured with an InGaAs channel on a GaAs sub-fin with a thin-InAlAs diffusion barrier beneath the active channel in accordance with an embodiment of the present disclosure. Reference labels A and B refer to the corresponding horizontal and vertical energy-dispersive X-ray spectroscopy (EDS) scans respectively shown on the bottom panel of each image. The horizontal EDS scan (A) of FIG. 4a shows indium in the $In_xGa_{1-x}As$ at ~25% (i.e., x≈0.25) whereas the EDS scan (A) of FIG. 4b shows indium at ~70% (i.e., x≈0.7). This boost in the percentage of indium in the InGaAs region can be attributed to the thin-$In_{x-1}Al_xAs$ barrier layer just underneath the channel, where the concentration of aluminum is in the range of 40% to 60% (e.g., x=0.4 to 0.6).

The conclusion is further supported by the vertical EDS scan (B) which runs from the top of the fin to a lower portion of the fin. Scan B of FIG. 4b conclusively shows that the lower portion of the fin which is closest to the InAlAs surface is indium-poor whereas the top of the fin is indium-rich. But, scan B of FIG. 4a shows that the bottom of the fin closest to the GaAs sub-fin surface is actually richer in indium than the top portion of the fin. The EDS scans make sense since the indium precursor has a lower cracking temperature compared to the gallium precursor, and hence the first few monolayers of InGaAs on GaAs surface tend to be indium-rich. But, the unusual EDS scan B shown in FIG. 4b can only be attributed to the presence of the thin-InAlAs layer which drives the re-organization of the indium-gallium atoms in InGaAs channel in this graded fashion. A similar effect occurs with other aluminum-containing III material stacks, as will be appreciated in light of this disclosure.

So, in spite of using the same indium flow in InGaAs on both the structures shown in FIGS. 4a-b, the indium concentration in the top of the fin is clearly boosted up by almost 3× in FIG. 4b because of the presence of the thin-InAlAs barrier layer just underneath the channel. This drives the mobility of the transistor device by almost 3× with respect to a device made with the configuration shown in FIG. 4b. FIG. 5a illustrates a composition map of the GaAs/InGaAs stack configured without a thin InAlAs barrier layer shown in FIG. 4a, and FIG. 5b illustrates a composition map of a GaAs/InGaAs stack configured with a thin InAlAs barrier layer shown in FIG. 4b, in accordance with an example embodiment of the present disclosure.

Example System

Figure 6:
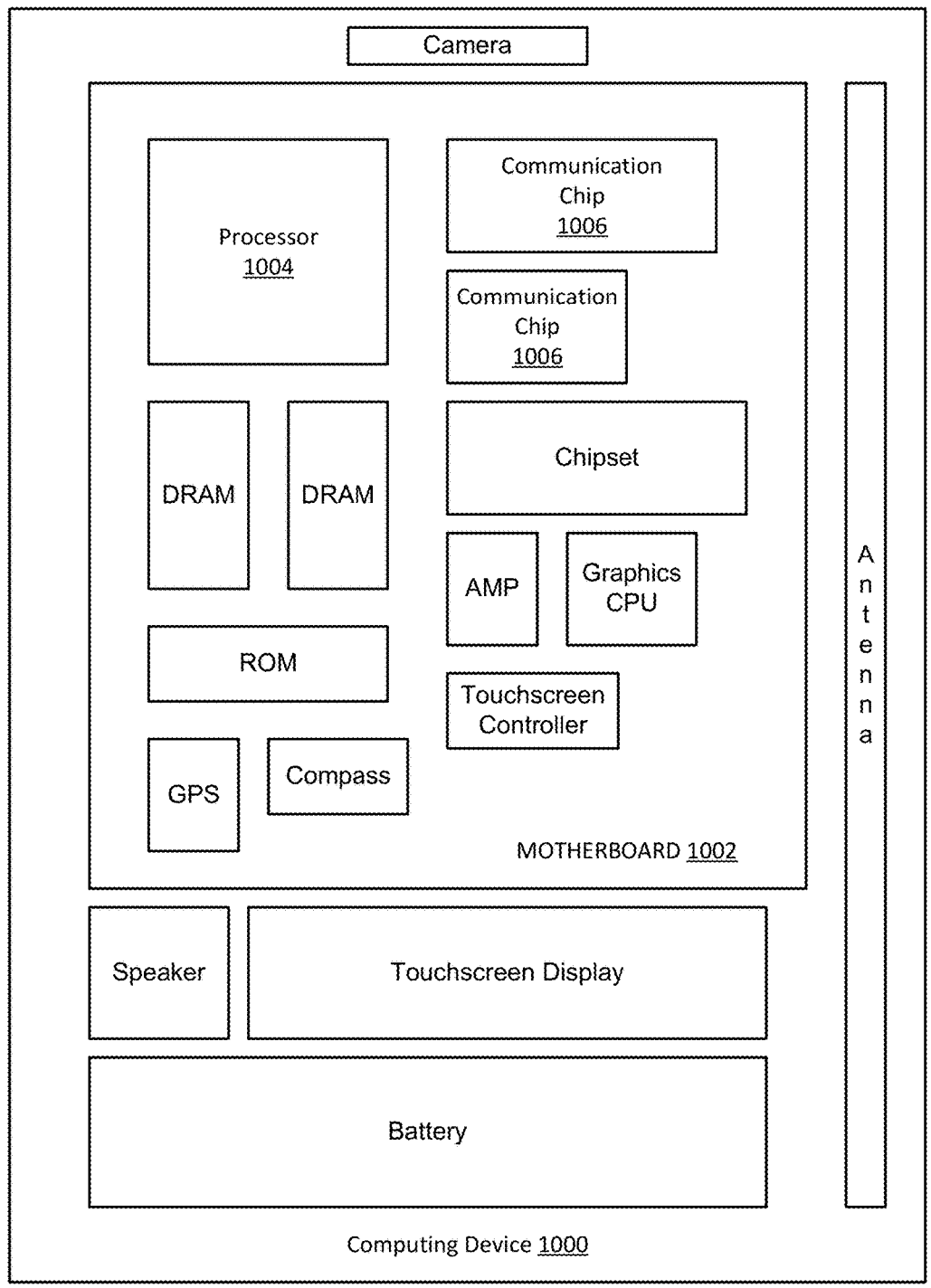
FIG. 6 illustrates a computing system implemented with one or more integrated circuit structures configured in accordance with an embodiment of the present disclosure.

FIG. 6 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with an indium-rich channel region electrically isolated from the sub-fin by an aluminum-containing barrier layer, as variously provided herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more transistors configured with an indium-rich channel region electrically isolated from the sub-fin by an aluminum-containing barrier layer, as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more transistors having indium-rich channel regions electrically isolated from the sub-fin by an aluminum-containing barrier layer, as variously provided herein. As will be appreciated in light of this disclosure, note that multi-standard wireless capability may be integrated directly into the processor 1004 (e.g., where functionality of any chip 1006 is integrated into processor 1004, rather than having separate communication chips). Further note that processor 1004 may be a chip set having such wireless capability. In short, any number of processor(s) 1004 and/or communication chip(s) 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs transistor devices as described herein. As will be appreciated in light of this disclosure, various embodiments of the present disclosure can be used to improve performance on products fabricated at any process node (e.g., in the micron range, or sub-micron and beyond) by allowing for the use of fin-based transistors having high mobility customized and diverse channel configurations on the same die.

Further Example Embodiments

The following examples pertain to further embodiments, from which numerous permutations and configurations will be apparent.

Example 1 is an integrated circuit device including: a substrate; and a plurality of fins extending from the substrate, each fin including a III-V material sub-fin, an indium-rich channel layer above the sub-fin, and an aluminum-containing barrier layer between the III-V material sub-fin and the indium-rich channel layer.

Example 2 includes the subject matter of Example 1, and further includes at least one of: a gate stack over each of the fins; and source and drain regions formed adjacent the gate stack.

Example 3 includes the subject matter of Example 1 or 2, and further includes an indium-containing layer that begins on the III-V material sub-fin and includes the indium-rich channel layer, and the aluminum-containing barrier layer is within the indium-containing layer.

Example 4 includes the subject matter of Example 3, wherein the indium concentration of the indium-containing layer is graded from an indium-poor concentration near the III-V material sub-fin to an indium-rich concentration at the indium-rich channel layer. The indium-rich channel layer is at or otherwise proximate to the top of the fin, according to some example embodiments.

Example 5 includes the subject matter of Example 3, wherein the indium concentration of the indium-containing layer is graded from an indium-poor concentration near the aluminum-containing barrier layer to an indium-rich concentration at the indium-rich channel layer. The indium-rich channel layer is at or otherwise proximate to the top of the fin, according to some example embodiments.

Example 6 includes the subject matter of Example 1 or 2, wherein the aluminum-containing barrier layer is between the III-V material sub-fin and the indium-rich channel layer and not within the indium-rich channel layer.

Example 7 includes the subject matter of Example 6, wherein the indium concentration of the indium-rich channel layer is graded from an indium-poor concentration near the aluminum-containing barrier layer to an indium-rich concentration at or toward the top of the fin.

Example 8 includes the subject matter of any of the preceding Examples, wherein the indium concentration of the indium-rich channel layer is graded from an indium-poor concentration near the aluminum-containing barrier layer to an indium-rich concentration at the top of the fin. Note that the indium-rich concentration may continue over a distance of the fin, such as from some fin mid-point to the fin top. The indium concentration within that indium-rich fin distance may vary (e.g., up and/or down, as the case may be), but still maintain its rich status relative to other components in the indium-rich layer. Further note that the maximum indium concentration need not be at the top (i.e., an indium-rich concentration does not necessarily have to be the maximum indium concentration).

Example 9 includes the subject matter of any of the preceding Examples, wherein the surface of the substrate where the III-V material sub-fin contacts the substrate is faceted.

Example 10 includes the subject matter of any of the preceding Examples, wherein the III-V material sub-fin comprises gallium arsenide, the indium-rich channel layer comprises indium gallium arsenide, and the aluminum-containing barrier layer comprises aluminum arsenide.

Example 11 includes the subject matter of Example 10, wherein the aluminum-containing barrier layer comprises indium aluminum arsenide.

Example 12 includes the subject matter of Example 11, wherein the percentage of aluminum in the aluminum-containing barrier layer, and the percentage of indium in the indium-rich channel layer, are such that both a maximum aluminum concentration of the aluminum-containing barrier layer and a maximum indium concentration of the indium-rich channel layer are within a range of 45% to 55%. So, for instance, given $In_{1-x}Al_xAs$ for the aluminum-containing layer and $In_xGa_{1-x}As$ for the indium-rich channel layer, x refers to the percentage of aluminum in the aluminum-containing layer and indium in the indium-rich channel layer (where x varies from 0.45 to 0.55 and is multiplied by 100 to be measured as a percentage).

Example 13 includes the subject matter of Example 11, wherein the percentage of aluminum in the aluminum-containing barrier layer, and the percentage of indium in the indium-rich channel layer, are such that both a maximum aluminum concentration of the aluminum-containing barrier layer and a maximum indium concentration of the indium-rich channel layer are within a range of 46% to 52%. So, for instance, given $In_{1-x}Al_xAs$ for the aluminum-containing layer and $In_xGa_{1-x}As$ for the indium-rich channel layer, x refers to the percentage of aluminum in the aluminum-containing layer and indium in the indium-rich channel layer (where x varies from 0.46 to 0.52 and is multiplied by 100 to be measured as a percentage).

Example 14 includes the subject matter of Example 13, wherein the aluminum-containing barrier layer is InAlAs, and the indium-rich channel layer is InGaAs.

Example 15 includes the subject matter of any of the preceding Examples, wherein aluminum concentration of the aluminum-containing barrier layer and indium concentration of the indium-rich channel layer are configured to provide a defect density of less than 10000 defects per linear cm.

Example 16 includes the subject matter of any of the preceding Examples, wherein aluminum concentration of the aluminum-containing barrier layer and indium concentration of the indium-rich channel layer are configured to provide a defect density of less than 1000 defects per linear cm.

Example 17 includes the subject matter of any of the preceding Examples, wherein aluminum concentration of the aluminum-containing barrier layer and indium concentration of the indium-rich channel layer are configured to provide a defect density of less than 100 defects per linear cm.

Example 18 includes the subject matter of any of the preceding Examples, wherein aluminum concentration of the aluminum-containing barrier layer and indium concentration of the indium-rich channel layer are configured to be within 10% of each other.

Example 19 includes the subject matter of any of the preceding Examples, wherein aluminum concentration of the aluminum-containing barrier layer and indium concentration of the indium-rich channel layer are configured to be within 5% of each other.

Example 20 includes the subject matter of any of the preceding Examples, wherein aluminum-containing barrier layer has a nominal thickness in the range of 5 nm to 20 nm.

Example 21 includes the subject matter of any of the preceding Examples, wherein the substrate is silicon. In one such case, the substrate is a bulk silicon substrate, such as a silicon wafer.

Example 22 is an integrated circuit device, comprising: a silicon substrate; a plurality of fins extending from the substrate, each fin including a III-V material sub-fin, an indium-rich channel layer above the sub-fin, and an aluminum-containing barrier layer between the III-V material sub-fin and the indium-rich channel layer, wherein the surface of the substrate where the III-V material sub-fin contacts the substrate is faceted, and wherein aluminum concentration of the aluminum-containing barrier layer and indium concentration of the indium-rich channel layer are configured to be within 10% of each other; a gate stack over each of the fins; and source and drain regions formed adjacent the gate stack.

Example 23 includes the subject matter of Example 22, and further includes an indium-containing layer that begins on the III-V material sub-fin and includes the indium-rich channel layer, and the aluminum-containing barrier layer is within the indium-containing layer.

Example 24 includes the subject matter of Example 23, wherein the indium concentration of the indium-containing layer is graded from an indium-poor concentration near the III-V material sub-fin to an indium-rich concentration at the indium-rich channel layer. The indium-rich channel layer is at or otherwise proximate to the top of the fin, according to some example embodiments.

Example 25 includes the subject matter of Example 23 or 24, wherein the indium concentration of the indium-rich channel layer is graded from an indium-poor concentration near the aluminum-containing barrier layer to an indium-rich concentration at or toward the top of the fin.

Example 26 includes the subject matter of Example 22, wherein the aluminum-containing barrier layer is between the III-V material sub-fin and the indium-rich channel layer and not within the indium-rich channel layer.

Example 27 includes the subject matter of Example 26, wherein the indium concentration of the indium-rich channel layer is graded from an indium-poor concentration near the aluminum-containing barrier layer to an indium-rich concentration at or toward the top of the fin.

Example 28 includes the subject matter of any of Examples 22 through 27, wherein the percentage of aluminum in the aluminum-containing barrier layer, and the percentage of indium in the indium-rich channel layer, are such that both a maximum aluminum concentration of the aluminum-containing barrier layer and a maximum indium concentration of the indium-rich channel layer are within a range of 46% to 52%. So, for instance, given $In_{1-x}Al_xAs$ for the aluminum-containing layer and $In_xGa_{1-x}As$ for the indium-rich channel layer, x refers to the percentage of aluminum in the aluminum-containing layer and indium in the indium-rich channel layer (where x varies from 0.46 to 0.52 and is multiplied by 100 to be measured as a percentage).

Example 29 includes the subject matter of Example 28, wherein the aluminum-containing barrier layer is InAlAs, and the indium-rich channel layer is InGaAs.

Example 30 is an integrated circuit device, comprising: a silicon substrate; a plurality of fins extending from the substrate, each fin including a III-V material sub-fin, an indium-rich channel layer above the sub-fin, and an aluminum-containing barrier layer between the III-V material sub-fin and the indium-rich channel layer, wherein the surface of the substrate where the III-V material sub-fin contacts the substrate is faceted, and wherein the indium concentration of the indium-rich channel layer is graded from an indium-poor concentration near the aluminum-containing barrier layer to an indium-rich concentration at or toward the top of the fin; a gate stack over each of the fins; and source and drain regions formed adjacent the gate stack.

Example 31 includes the subject matter of Example 30, wherein aluminum concentration of the aluminum-containing barrier layer and indium concentration of the indium-rich channel layer are configured to be within 10% of each other.

Example 32 includes the subject matter of Example 30 or 31, wherein aluminum concentration of the aluminum-containing barrier layer and indium concentration of the indium-rich channel layer are configured to be within 5% of each other.

Example 33 includes the subject matter of any of Examples 30 through 32, wherein aluminum-containing barrier layer has a nominal thickness in the range of 5 nm to 20 nm.

Example 34 includes the subject matter of any of Examples 30 through 33, wherein the percentage of aluminum in the aluminum-containing barrier layer, and the percentage of indium in the indium-rich channel layer, are such that both a maximum aluminum concentration of the aluminum-containing barrier layer and a maximum indium concentration of the indium-rich channel layer are within a range of 46% to 52%. So, for instance, given $In_{1-x}Al_xAs$ for the aluminum-containing layer and $In_xGa_{1-x}As$ for the indium-rich channel layer, x refers to the percentage of aluminum in the aluminum-containing layer and indium in the indium-rich channel layer (where x varies from 0.46 to 0.52 and is multiplied by 100 to be measured as a percentage).

Example 35 includes the subject matter of Example 35, wherein the aluminum-containing barrier layer is InAlAs, and the indium-rich channel layer is InGaAs.

The foregoing description of example embodiments of the present disclosure has been presented for the purposes of illustration and description. It is not intended to be exhaustive or to limit the disclosure to the precise forms disclosed. Many modifications and variations are possible in light of this disclosure. For instance, while the techniques are discussed primarily in the context of forming transistors such as FETs, other devices can be made as well such as diodes, variable capacitors, dynamic resistors, etc. It is intended that the scope of the present disclosure be limited not by this detailed description, but rather by the claims appended hereto.

What is claimed is:

1. An integrated circuit including at least one transistor device, the integrated circuit comprising:
   a substrate;
   insulator material above and in contact with the substrate; and
   a plurality of fins extending from the substrate, one or more of the fins including a sub-fin layer between portions of the insulator material, the sub-fin layer including one or more group III-V materials, a first layer above the sub-fin layer, the first layer including indium, gallium, and arsenic, the indium concentration of the first layer being greater than the gallium concentration of the first layer, and a second layer between the sub-fin layer and the first layer, the second layer including aluminum.

2. The integrated circuit of claim 1 further comprising a third layer between the sub-fin layer and the second layer, the third layer including indium, gallium, and arsenic.

3. The integrated circuit of claim 2 wherein the indium concentration of the third layer is graded from a low concentration near the sub-fin layer to a relatively higher concentration near the second layer.

4. The integrated circuit of claim 1 wherein the second layer is between the portions of the insulator material.

5. The integrated circuit of claim 1 wherein the second layer is in direct contact with the sub-fin layer, and the first layer is in direct contact with the second layer.

6. The integrated circuit of claim 1 wherein at least a portion of the second layer is above the portions of the insulator material.

7. The integrated circuit of claim 1 wherein the indium concentration of the first layer is graded from a low concentration near the second layer to a relatively higher concentration at the top of the one or more fins.

8. The integrated circuit of claim 1 wherein the one or more group III-V materials included in the sub-fin layer comprises gallium and arsenic.

9. The integrated circuit of claim 1 wherein the second layer further includes indium and arsenic.

10. The integrated circuit of claim 1 wherein the second layer further includes indium and arsenic in a group III-V material of indium aluminum arsenide, the aluminum concentration of the group III component of the indium aluminum arsenide within a range of 46% to 52%.

11. The integrated circuit of claim 1 wherein the indium, gallium, and arsenic included in the first layer is a group III-V material of indium gallium arsenide, the indium concentration of the group III component of the indium gallium arsenide within a range of 53% to 70%.

12. The integrated circuit of claim 1 wherein the aluminum concentration of the second layer and the indium concentration of the first layer are within 5% of each other.

13. An integrated circuit including at least one transistor device, the integrated circuit comprising:
a substrate including silicon;
a plurality of fins extending from the substrate, one or more of the fins including a sub-fin layer between portions of insulator material, the sub-fin layer including one or more group III-V materials, a first layer above the sub-fin layer, the first layer including indium, and a second layer between the sub-fin layer and the first layer, wherein the sub-fin layer contacts a surface of the substrate that is faceted, and wherein the aluminum concentration of the second layer and the indium concentration of the first layer are within 10% of each other;

a gate stack over the one or more fins; and
source and drain regions adjacent the gate stack.

14. The integrated circuit of claim 13 further comprising a third layer between the sub-fin layer and the second layer, the third layer including indium.

15. The integrated circuit of claim 14 wherein the indium concentration of the third layer is graded from a low concentration near the sub-fin layer to a relatively higher concentration near the second layer.

16. The integrated circuit of claim 14 wherein the second layer is between portions of the insulator material.

17. The integrated circuit of claim 13 wherein the second layer is in direct contact with the sub-fin layer, and the first layer is in direct contact with the second layer.

18. The integrated circuit of claim 17 wherein the indium concentration of the first layer is graded from a low concentration near the second layer to a relatively higher concentration at or toward the top of the one or more fins.

19. An integrated circuit including at least one transistor device, the integrated circuit comprising:
a substrate including silicon;
a plurality of fins extending from the substrate, one or more of the fins including a sub-fin layer between portions of insulator material, the sub-fin layer including one or more group III-V materials, a first layer above the sub-fin layer, the first layer including indium, and a second layer between the sub-fin layer and the first layer, wherein the sub-fin layer contacts a surface of the substrate that is faceted, and wherein the indium concentration of the first layer is graded from a low concentration near the second layer to a relatively higher concentration at the top of the one or more fins;

a gate stack over the one or more fins; and
source and drain regions adjacent the gate stack.

20. The integrated circuit of claim 19 wherein the aluminum included in the second layer is a component of indium aluminum arsenide, and the indium included in the first layer is a component of indium gallium arsenide.

* * * * *